United States Patent [19]
Lee

[11] Patent Number: 6,159,774
[45] Date of Patent: *Dec. 12, 2000

[54] MULTI-LAYER INTERCONNECTION LAYOUT BETWEEN A CHIP CORE AND PERIPHERAL DEVICES

[75] Inventor: Jeong-Soo Lee, Yongin, Rep. of Korea

[73] Assignee: Samsung Electronics Co., Ltd., Kyungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/151,434

[22] Filed: Sep. 11, 1998

[30] Foreign Application Priority Data

Dec. 20, 1997 [KR] Rep. of Korea ............... 97-71283

[51] Int. Cl.$^7$ ................. H01L 21/44; H01L 21/48; H01L 21/50
[52] U.S. Cl. ................. 438/118; 438/617; 438/622; 438/666
[58] Field of Search ................. 257/734, 784, 257/786, 48, 211, 202, 204, 206, 209, 692, 693, 296, 691, 776, 758, 700, 701; 364/489, 39, 41; 438/106, 118, 617, 622, 666

[56] References Cited

U.S. PATENT DOCUMENTS

| | | | |
|---|---|---|---|
| 4,775,942 | 10/1988 | Ferreri et al. | 364/491 |
| 4,879,712 | 11/1989 | Littlewood | 370/218 |
| 5,363,182 | 11/1994 | Yuen | 257/202 |
| 5,441,916 | 8/1995 | Motonami . | |
| 5,451,763 | 9/1995 | Pickett et al. | 235/492 |
| 5,623,160 | 4/1997 | Liberkowski | 257/621 |
| 5,644,496 | 7/1997 | Agrawal et al. | 364/489 |
| 5,654,564 | 8/1997 | Mohsen | 257/211 |
| 5,659,192 | 8/1997 | Arima | 257/296 |
| 5,665,989 | 9/1997 | Dangelo . | |
| 5,691,209 | 11/1997 | Liberkowski . | |
| 5,781,032 | 7/1998 | Bertin et al. | 257/686 |
| 5,789,770 | 8/1998 | Rostoker et al. | 257/204 |
| 5,801,412 | 9/1998 | Tobita | 257/206 |
| 5,815,454 | 9/1998 | Tomishima et al. | 365/226 |
| 5,847,430 | 12/1998 | Hidaka | 257/363 |

*Primary Examiner*—Kevin M. Picardat
*Assistant Examiner*—D. M. Collins
*Attorney, Agent, or Firm*—F. Chau & Associates, LLP

[57] ABSTRACT

An integrated circuit chip has a multi-layer input/output pad interconnection structure which allows input/output buffers to be flexibly coupled to input/output pads depending on the chip's applications. To obtain the multi-layer pad interconnection structure, a first interconnection layer is formed on a layer of a semiconductor wafer such that the first interconnection layer is electrically coupled to the input/output buffers. The first interconnection layer is patterned into the first interconnection lines. An insulating layer is formed on the first interconnection layer. A second interconnection layer is formed on the insulating layer such that the second interconnection layer is electrically coupled to the input/output pads and the first interconnection lines. The first interconnection lines and the second interconnection layer are electrically coupled to each other via contacts. The second interconnection layer is then patterned into a plurality of second interconnection lines.

8 Claims, 2 Drawing Sheets

MULTI-LAYER INTERCONNECTION LAYOUT BETWEEN A CHIP CORE AND PERIPHERAL DEVICES

FIELD OF THE INVENTION

The present invention relates to integrated circuits and, more particularly, to input/output pad interconnection structure and method for manufacturing the same.

BACKGROUND OF THE INVENTION

In the manufacture of Integrated Circuit (IC) chips or dies, such as microcontroller (or single chip microcomputer), high density semiconductor memory devices, or the like, it is a common practice to simultaneously fabricate a plurality of identical circuits on a thin slice or a flat disk of semiconductor material called a wafer, and subsequently separating the circuits on the wafer into individual chips. Due to the current trend toward miniaturization of electronic components and also to reduce manufacturing costs by increasing the number of chips available from a single wafer, it is desirable to make each individual die as small as possible.

With advances on the development and manufacture of IC chips, the electronics industry is able to produce products which are increasingly more powerful, reliable, functional, user-friendly, and inexpensive. IC chips are widely utilized in a variety of electronic devices, e.g., personal computers, camcorders, televisions, mobile phones, etc. The IC chips operate or facilitate the operations of these devices reliably and efficiently.

FIG. 1 shows a prior art IC chip, e.g., a microcontroller chip, which includes a chip core 100 having a plurality of functioning circuits (not shown) and a plurality of input/output buffer circuits (or input/output ports) 110, 112, . . . , and 114. The IC chip includes a plurality of input/output pads 10, 12, . . . , and 14 located at the periphery of the chip, and interconnection lines 50, 52, . . . , and 54 for electrically coupling the ports and pads together.

In general, an IC chip is designed to have such a pad interconnection layout that one input/output pad 10, 12, . . . , or 14 is arranged to correspond to only one input/output buffer 110, 112, . . . , or 114, and they are electrically coupled to each other via a corresponding interconnection line 50, 52, . . . , or 54.

A microcontroller chip may be useable in numerous different applications, and thus the chip may need to be encased in various kinds of packages, such as DIP (dual-in-line package), SDIP (shrink DIP), QFP (quad flat package) with 28, 42, 44 pins, or the like, depending upon the nature of the applications. This means that input/output ports (or buffers) of a microcontroller chip should be disposed at proper positions depending on the chip applications and the type of package. However, it is difficult to package a microcontroller chip in different kinds of packages if input/output pads and buffers of the chip are inflexibly laid out, as shown in FIG. 1.

Accordingly, a need exists to provide an integrated circuit chip with input/output pad interconnection layout which allows input/output buffers to be flexibly coupled to input/output pads depending on the chip's applications. It is also desirable to provide a method for manufacturing an input/output pad interconnection structure for an integration circuit chip which can present a flexible connectivity between the chip's input/output buffers and pads.

SUMMARY OF THE INVENTION

According to an aspect of the present invention, an integrated circuit (IC) chip includes a chip core which has a plurality of input/output buffers and a plurality of input/output pads disposed about the periphery of the chip. The input/output buffers are arranged in a first direction, but the input/output pads are arranged in a second direction which is substantially orthogonal to the first direction. Also, the IC chip includes a plurality of first interconnection lines and a plurality of second interconnection lines. The first interconnection lines are electrically coupled to the input/output buffers, respectively. The second interconnection lines are electrically coupled to the input/output pads, respectively. A plurality of contacts are formed at selected intersection positions of the first and second interconnection lines during chip manufacturing process such that each contact couples a selected one of the first interconnection lines with a selected one of the second interconnection lines. The IC chip also includes first and second layers which are electrically isolated from each other. The first interconnection lines are formed on the first layer, and the second interconnection lines are formed on the second layers.

According to a pad interconnection manufacturing method of this invention, a first interconnection layer is formed on a layer of a semiconductor wafer. The first interconnection layer is electrically coupled to the input/output buffers arranged in a column (or in a first direction). The first interconnection layer is then patterned into the first interconnection lines which run along rows (or in a second direction). An insulating layer is formed on the first interconnection layer, and then a plurality of contact holes at selected positions on the insulating layer such that the first interconnection lines are exposed. The contact holes are filled with conductive material to form a plurality of contacts. A second interconnection layer is formed on the insulating layer. The second interconnection layer is electrically coupled to the input/output pads arranged in a row. The second interconnection layer is then patterned into a plurality of second interconnection lines which run along columns. The first and second interconnection lines are electrically coupled to each other via the contacts, respectively.

The present invention will be better understood from the following detailed description of the exemplary embodiments thereof taken in conjunction with the accompanying drawings.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Preferred embodiments of the present invention will now be described with reference to the accompanying drawings.

The following detailed description is of the best modes presently contemplated by the inventors for practicing the invention. It should be understood that the description of these preferred embodiments is merely illustrative and that it should not be taken in a limiting sense.

Figure 1:
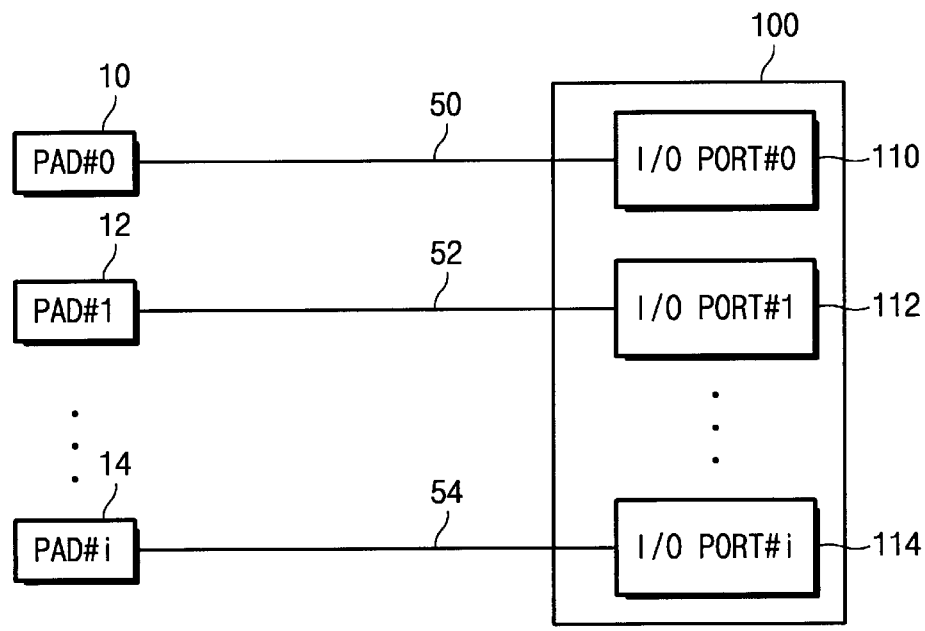
FIG. 1 is a schematic view of a conventional pad interconnection layout.
Figure 2:
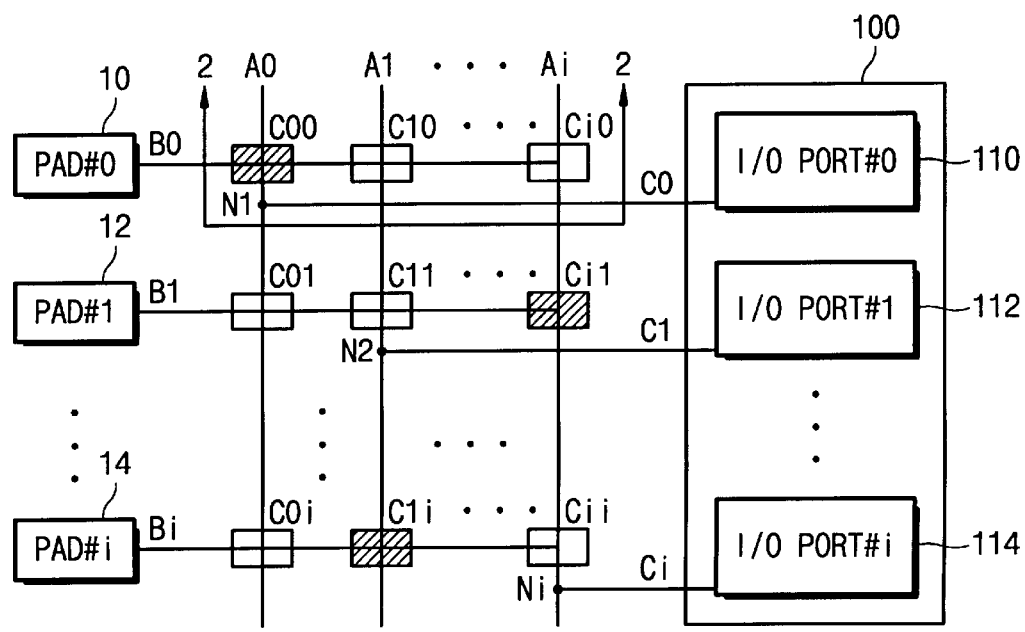
FIG. 2 is a schematic view of a preferred embodiment of a pad interconnection layout according to the present invention.

Referring to FIG. 2, a preferred embodiment of a pad interconnection layout of an integrated circuit (IC) chip according to the present invention is illustrated. The IC chip, e.g., microcontroller (microcomputer or microprocessor) includes a chip core 100 containing a plurality of input/output buffers (or ports) 110, 112, . . . , and 114 arranged in a column (in a first direction) and a plurality of input/output pads 10, 12, . . . , and 14 disposed about the periphery of the chip and arranged in a column. A plurality of first interconnection lines C0, C1, . . ., and Ci are arranged in rows (in a second direction) and electrically coupled to the input/output buffers, respectively. Also, a plurality of second interconnection lines A0, A1, A2, . . . , and Ai are arranged in columns. A plurality of first contacts N1, N2, . . . , Ni are defined at selected intersection positions of the first and second interconnection lines. Each of the first contacts Ni, N2, . . . , Ni electrically couples a selected one of the first interconnection lines C0, C1, , and Ci with a selected one of the second interconnection lines A0, A1, A2, . . . , and Ai. For example, contact N2 is electrically coupled between interconnection lines C1 and A1. Further, a plurality of third interconnection lines B0, B1. . . , and Bi are arranged in rows and electrically coupled to the input/output pads 10, 12, . . . , and 14. Although not shown in the FIG. 2, it will be well understood that first through third interconnection lines are respectively formed on first through third layers which are electrically isolated from each other. In addition, a plurality of second contacts, e.g., C00, Ci1, . . . , C1i, are defined at selected intersection positions of the second and third interconnection lines during pad interconnection manufacturing process. Each of the second contacts is electrically coupling a selected one of the second interconnection lines A0, A1, . . . , and Ai with a selected one of the third interconnection lines B0, B11, , and Bi. For example, contact C00 is electrically coupled between interconnection lines A0 and B0.

To obtain the pad interconnection structure described above, the IC chip has a multi-layer pad interconnection structure. A method of manufacturing a multi-layer pad interconnection structure according to this embodiment will now be described below.

A first interconnection layer is formed on a layer of a semiconductor wafer. The first interconnection layer is electrically coupled to the input/output buffers 110, 112, . . . , 114 within the chip core 100. The first interconnection layer is then patterned into the first interconnection lines C0, C1, . . . , Ci which run along rows.

A first insulating layer is formed on the first interconnection layer. A plurality of first contact holes N1, N2, . . . , and Ni are formed at selected positions on the first insulating layer such that the first interconnection lines are exposed. The first contact holes are then filled with conductive material, such as metal, polysilicon, or the like, to form a plurality of first contacts N1, N2, . . . , and Ni.

Next, a second interconnection layer is formed on the first insulating layer, and it is patterned into a plurality of second interconnection lines A0, A1, . . . , and Ai which runs along columns. The first and second interconnection lines C0, C1, . . . , Ci, A0, A1, . . . , and Ai are electrically coupled to each other via the first contacts N1, N2, . . . , and Ni, respectively.

A second insulating layer is formed on the second interconnection layer. A plurality of second contact holes are formed at selected positions on the second insulating layer such that the second interconnection lines A0, A1, A2 . . . , and Ai are exposed. The second contact holes are also filled the conductive material to form a plurality of second contacts, for example, C00, Ci1 . . . , and C1i.

Subsequently, a third interconnection layer is formed on the second insulating layer so as to be electrically coupled to a corresponding input/output pad. The third interconnection layer is then patterned to a plurality of third interconnection lines B0, B1, . . . , Bi which run along rows. The second and third interconnection lines A0, A1 . . . , Ai, B0, B1, . . . , Bi are electrically coupled to each other via the second contacts (e.g., C00, Ci1, . . . , and C1i), respectively.

Figure 4:
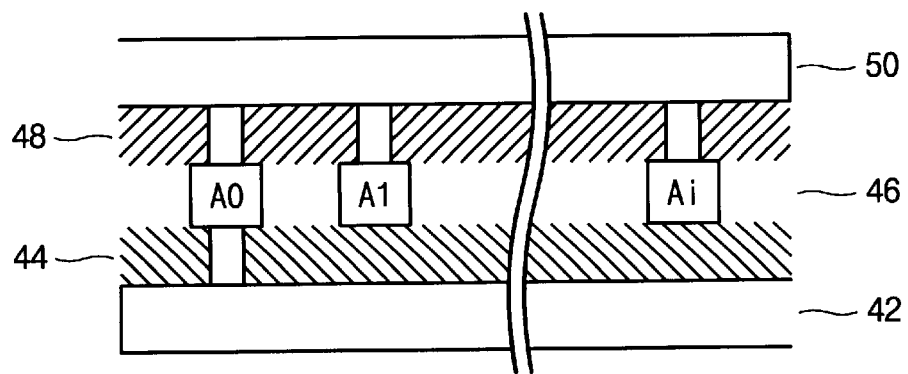
FIG. 4 is a cross sectional view taken at section line 2—2 of FIG. 2 in accordance with the present invention.

FIG. 4 is a cross sectional view taken at section line 2—2 of FIG. 2 in accordance with the present invention. Referring to FIG. 4, as described above, the multi-layer interconnection structure comprises the first interconnection layer 42 formed on a layer of a semiconductor wafer, the first insulating layer 44 formed on the first interconnection layer 42, the second interconnection layer 46 formed on the first insulating layer 44, the second insulating layer 48 formed on the second interconnection layer 46, and the third interconnection layer 50 formed on the second insulating layer 48.

Figure 3:
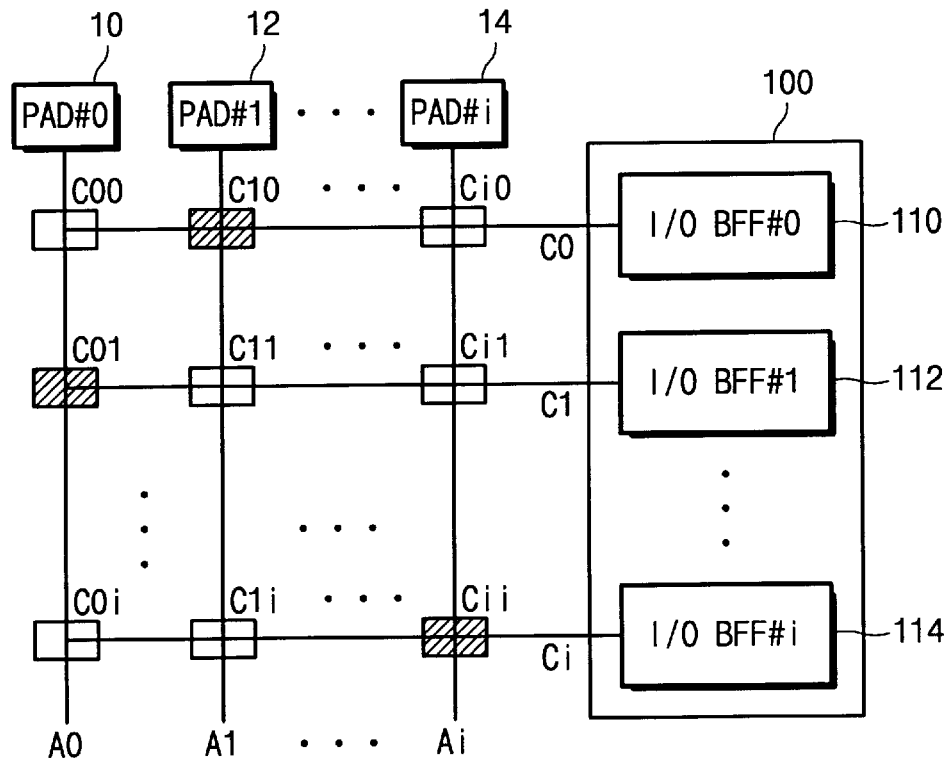
FIG. 3 is a schematic view of another preferred embodiment of a pad interconnection layout according to the present invention.

FIG. 3 schematically illustrates another preferred embodiment of a pad interconnection layout according to the present invention. Referring to FIG. 3, the IC chip also includes a chip core 100 which has a plurality of input/output buffers 110, 112, . . . , 114 and a plurality of input/output pads 10, 12, . . . , 14 disposed about the periphery of the chip but arrange in a row unlike the previous embodiment. The IC chip further includes a plurality of first interconnection lines C0, C1, . . . , and Ci and a plurality of second interconnection lines A0, A1, . . . , Ai. The first interconnection lines C0, C1, . . . , and Ci are electrically coupled to the input/output buffers 110, 112, . . . , and 114, respectively. The second interconnection lines A0, A1, . . . , and Ai are electrically coupled to the input/output pads 10, 12, . . . , and 14, respectively. A plurality of contacts, e.g., C10, C01, . . . , and Cii are formed at selected intersection positions of the first and second interconnection lines during chip manufacturing process, and so each contact couples a selected one of the first interconnection lines with a selected one of the second interconnection lines. The first and second layers of the IC chip are electrically isolated from each other by an insulating layer (not shown). The first interconnection lines C0, C1, . . . , and Ci are formed on the first layer, and the second interconnection lines A0, A1, . . . , and Ai are formed on the second layers.

A method of manufacturing a multi-layer pad interconnection structure according to this embodiment will now be described below.

A first interconnection layer is formed on a layer of a semiconductor wafer such that the first interconnection layer is electrically coupled to the input/output buffers 110, 112,. . . , and 114 arranged in a column. The first interconnection layer is patterned into the first interconnection lines C0, C1, . . . , and Ci which run along rows.

An insulating layer is then formed on the first interconnection layer, and a plurality of contact holes at selected positions on the insulating layer such that the first interconnection lines C0, C1, . . . , and Ci are exposed. The contact holes are filled with conductive material, such as metal, polysilicon, or the like, to form a plurality of contacts, for example, C10, C01, . . . , and Cii.

A second interconnection layer is formed on the insulating layer such that the second interconnection layer is electrically coupled to the input/output pads 10, 12, ... , and 14 arranged in a row. The second interconnection layer is then patterned into a plurality of second interconnection lines A0, A1, ... , and Ai which run along columns. The first and second interconnection lines C0, C1, ... , Ci, A0, A1, ... , and Ai are electrically coupled to each other via the contacts (e.g., C10, C01, ... , and Cii), respectively.

Numerous modifications and variations of the present invention are possible in light of the above teachings. It is therefore to be understood that, within the scope of the appended claims, the present invention can be practiced in a manner other than as specifically described herein.

What is claimed is:

1. A method for electrically connecting input/output (I/O) ports of a semiconductor device with a plurality of nodes, comprising the steps of: forming a first interconnection layer;

patterning the first interconnection layer to form a first set of interconnection lines, each of the first set of interconnection lines being connected with corresponding one of the I/O ports;

forming a first insulation layer on the first interconnection layer;

forming a second interconnection layer on the first insulation layer;

patterning the second interconnection layer to form a second set of interconnection lines which are arranged such that each of the second set of interconnection lines connects to corresponding one of a first set of nodes;

forming a first set of contacts at a first set of selected positions in the first insulation layer, each of the first set of contacts electrically coupling one of the first set of interconnection lines and one of the second set of interconnection lines at corresponding one of the first set of selected positions;

forming a second insulation layer on the second interconnection layer;

forming a third interconnection layer on the second insulation layer;

patterning the third interconnection layer to form a third set of interconnection lines which are arranged such that each of the third set of interconnection lines connects to corresponding one of a second set of nodes; and forming a second set of contacts at a second set of selected positions in the second insulation layer, each of the second set of contacts electrically coupling one of the second set of interconnection lines and one of the third set of interconnection lines at corresponding one of the second set of selected positions.

2. The method according to claim 1, wherein the PO ports are arranged in a first direction, the first set of nodes are arranged in a second direction, and the second set of nodes are arranged in the first direction, further comprising the steps of:

arranging the first set of interconnection lines in a second direction;

arranging the second set of interconnection lines in the first direction; and arranging the third set of interconnection lines in the second direction.

3. The method according to claim 1, wherein the step of forming a first set of contacts includes the steps of:

forming a first set of contact holes at the first set of selected positions on the first insulation layer, each of the first set of contact holes exposing a portion of one of the first set of interconnection lines at corresponding one of the first set of selected positions;

filling the first set of contact holes with electrically conductive material; and forming electrical connections at the first set of selected positions between the first set of contact holes filled with the conductive material and the second set of interconnection lines.

4. The method according to claim 1, wherein the step of forming a second set of contacts includes the steps of:

forming a second set of contact holes at the second set of selected positions on the second insulation layer, each of the second set of contact holes exposing a portion of one of the second set of interconnection lines at corresponding one of the second set of selected positions;

filling the second set of contact holes with electrically conductive material; and forming electrical connections at the second set of selected positions between the second set of contact holes filled with the conductive material and the third set of interconnection lines.

5. A method for electrically connecting input/output (I/O) ports of a semiconductor device with a plurality of nodes, comprising the steps of:

arranging the I/O ports in a first direction;

forming a first interconnection layer;

patterning the first interconnection layer to form a first set of interconnection lines arranged in a second direction, each of the first set of interconnection lines being connected to corresponding one of the 1/O ports;

forming an insulation layer on the first interconnection layer;

forming a second interconnection layer on the first insulation layer;

patterning the second interconnection layer to form a second set of interconnection lines arranged in the first direction, each of the second set of interconnection lines being connected to corresponding one of the nodes; and forming a plurality of contacts at selected positions in the insulation layer, each contact electrically coupling one of the first set of interconnection lines and one of the second set of interconnection lines at corresponding one of the selected positions.

6. The method according to claim 5, wherein the first direction is substantially orthogonal to the second direction.

7. The method according to claim 5, wherein the step of forming a plurality of contacts includes the steps of:

forming a plurality of contact holes at the selected positions on the insulation layer, each contact hole exposing a portion of one of the first set of interconnection lines at corresponding one of the selected positions;

filling the plurality of contact holes with electrically conductive material; and forming electrical connections at the selected positions between the plurality of contact holes filled with the conductive material and the second set of interconnection lines.

8. The method according to claim 2, wherein the first direction is substantially orthogonal to the second direction.

\* \* \* \* \*